(12) United States Patent
Katoh

(10) Patent No.: US 6,646,442 B2
(45) Date of Patent: Nov. 11, 2003

(54) VOLTAGE DETECTION DEVICE FOR A BATTERY PACKAGE

(75) Inventor: Tomoya Katoh, Nagoya (JP)

(73) Assignee: Denso Corporation, Kariya (JP)

( * ) Notice: Subject to any disclaimer, the term of this patent is extended or adjusted under 35 U.S.C. 154(b) by 52 days.

(21) Appl. No.: 10/128,241

(22) Filed: Apr. 24, 2002

(65) Prior Publication Data

US 2002/0158634 A1 Oct. 31, 2002

(30) Foreign Application Priority Data

Apr. 26, 2001 (JP) ........................................ 2001-129958

(51) Int. Cl.[7] ............................................. G01N 27/416
(52) U.S. Cl. ......................... 324/433; 324/426; 324/435
(58) Field of Search ............................... 324/425, 426, 324/430, 429, 432, 433, 434, 435, 444; 320/116, 118, 120, 124; 315/160, 161

(56) References Cited

U.S. PATENT DOCUMENTS 6,104,164 A * 8/2000 Iino et al. .................... 320/116

FOREIGN PATENT DOCUMENTS

| JP | A 11-160371 | 6/1999 |
|---|---|---|
| JP | A 11-248755 | 9/1999 |
| JP | A 2000-134818 | 5/2000 |
| JP | A 2000-193694 | 7/2000 |
| JP | A 2000-199771 | 7/2000 |

* cited by examiner

*Primary Examiner*—N. Le
*Assistant Examiner*—Vincent Q. Nguyen
(74) *Attorney, Agent, or Firm*—Oliff & Berridge, PLC

(57) ABSTRACT

To detect terminal voltages in a battery package including high and low potential groups connected in series, a positive terminal of one battery module in the high potential group outputting the highest potential is connected through a resistor to a junction point connected to a negative terminal of another battery module in the low potential group outputting the lowest potential through another resistor having the same resistance. Other positive and negative terminals of pairs of module battery outputting successive lower voltage potentials in the high potential group and successive higher voltage potentials in the low potential group are connected to junction points through resistors, respectively. Voltages at junction points, differences in voltage potential between the successive two junction points, or differences in potential between the junction points and a middle potential at the junction between the high and low groups is measured. Battery module voltages or variation are calculated.

12 Claims, 6 Drawing Sheets

VOLTAGE DETECTION DEVICE FOR A BATTERY PACKAGE

BACKGROUND OF THE INVENTION

1. Field of the Invention

This invention relates to a voltage detection device for a battery package.

2. Description of the Prior Art

Battery packages used in hybrid automobiles, electric cars, or fuel-cell-powered vehicles preferably include a plurality of battery modules connected in series because a high voltage output reduces transmission loss and provides miniaturization of motors.

In the battery package circuit with a high voltage output, an output voltage of each battery module was measured individually. However, in this case, the maximum voltage potential difference is large because of the series connection, so that the circuit elements in voltage detection device should have high withstand voltage requirements. In other words, a voltage detection device having a circuit structure allowing a low withstand voltage requirement is desired.

SUMMARY OF THE INVENTION

The aim of the present invention is to provide a superior voltage detection device for a battery package.

According to the present invention, a first aspect of the present invention provides a voltage detection device for a battery package including high and low voltage groups of battery modules connected in series, said high and low voltage groups including N of said battery modules connected in series, respectively, a positive terminal of said $L^{th}$ battery module in said high voltage group outputting the highest voltage potential in said battery package when L=1, a negative terminal of said $L^{th}$ battery module in said low voltage group outputting the lowest voltage potential in said battery package when L=1, $1 \leq L \leq N$;

N junction points;

2N current limiting resistive elements, a positive terminal of said $L^{th}$ battery module in said high voltage group being connected to said $L^{th}$ junction point through one of said current limiting resistive elements, a negative terminal of said $L^{th}$ battery module in said low voltage group being connected to said $L^{th}$ junction point through another one of said current limiting resistive elements; and voltage detection means for detecting and outputting voltage potentials at said N junction points.

According to the present invention, a second aspect of the present invention based on said first aspect provides the voltage detection device further comprising N voltage difference detection circuits for detecting and outputting voltage differences between said $L^{th}$ and $(L+1)^{th}$ junction points, respectively, wherein said $N^{th}$ voltage difference detection circuit detects a voltage difference between said $N^{th}$ junction point and a connection point between said high and low voltage groups of battery modules.

According to the present invention, a third aspect of the present invention based on said first aspect provides the voltage detection device further comprising potential difference detection means for detecting and outputting potential differences between voltage potentials at said N junction points and a reference voltage at a connection point between said high and low voltage groups of battery modules.

According to the present invention, a fourth aspect of the present invention based on said first aspect provides the voltage detection device further comprising data processing means for calculating output voltages of said 2N battery modules from said detected voltage potentials, respectively.

According to the present invention, a fifth aspect of the present invention based on said second aspect provides the voltage detection device further comprising data processing means for calculating output voltages of said 2N battery modules from outputs of said N voltage difference detection circuits, respectively.

According to the present invention, a sixth aspect of the present invention based on said third aspect provides the voltage detection device further comprising data processing means for calculating output voltages of said 2N battery modules from said detected potential differences, respectively.

According to the present invention, a seventh aspect of the present invention based on said fifth aspect provides the voltage detection device, wherein said data processing means calculates variations in said output voltages of said 2N battery modules, respectively.

According to the present invention, an eighth aspect of the present invention based on said sixth aspect provides the voltage detection device, wherein said data processing means calculates variations in said output voltages of said 2N battery modules, respectively.

According to the present invention, a ninth aspect of the present invention aspect provides the voltage detection device for a battery package including high and low voltage groups of battery modules connected in series, said high and low voltage groups including N of said battery modules connected in series, respectively, a positive terminal of said $L^{th}$ battery module in said high voltage group outputting the highest voltage potential in said battery package when L=1, a negative terminal of said $L^{th}$ battery module in said low voltage group outputting the lowest voltage potential in said battery package when L=1, $1 \leq L \leq N$;

N junction points;

2N current limiting resistive elements, a positive terminal of said $L^{th}$ battery module in said high voltage group being connected to said $L^{th}$ junction point through one of said current limiting resistive elements, a negative terminal of said $L^{th}$ battery module in said low voltage group being connected to said $L^{th}$ junction point through another one of said current limiting resistive elements; and voltage detection and operation means for detecting voltage potentials at said N junction points and for obtaining and outputting conditional data of said battery modules from said detected voltage potentials.

According to the present invention, a tenth aspect of the present invention based on the ninth aspect provides the voltage detection device, wherein said voltage detection and operation means comprises N voltage difference detection circuits for detecting voltage differences between said $L^{th}$ and $(L+1)^{th}$ junction points, respectively, wherein said $N^{th}$ voltage difference detection circuit detects a voltage difference between said $N^{th}$ junction point and a connection point between said high and low voltage groups of battery modules to obtain said conditional data from said detected voltage differences.

According to the present invention, an eleventh aspect of the present invention based on said ninth aspect provides the voltage detection device, wherein said voltage detection and operation means comprises potential difference detection means for detecting potential differences between voltage potentials at said N junction points and a reference voltage at a connection point between said high and low voltage groups of battery modules to obtain said conditional data from said detected potential differences.

According to the present invention, a twelfth aspect of the present invention based on the ninth aspect provides the voltage detection device, wherein said voltage detection and operation means comprises calculating means for calculating output voltages of said 2N battery modules from said detected voltage potentials, respectively.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

[First Embodiment]

Figure 1:
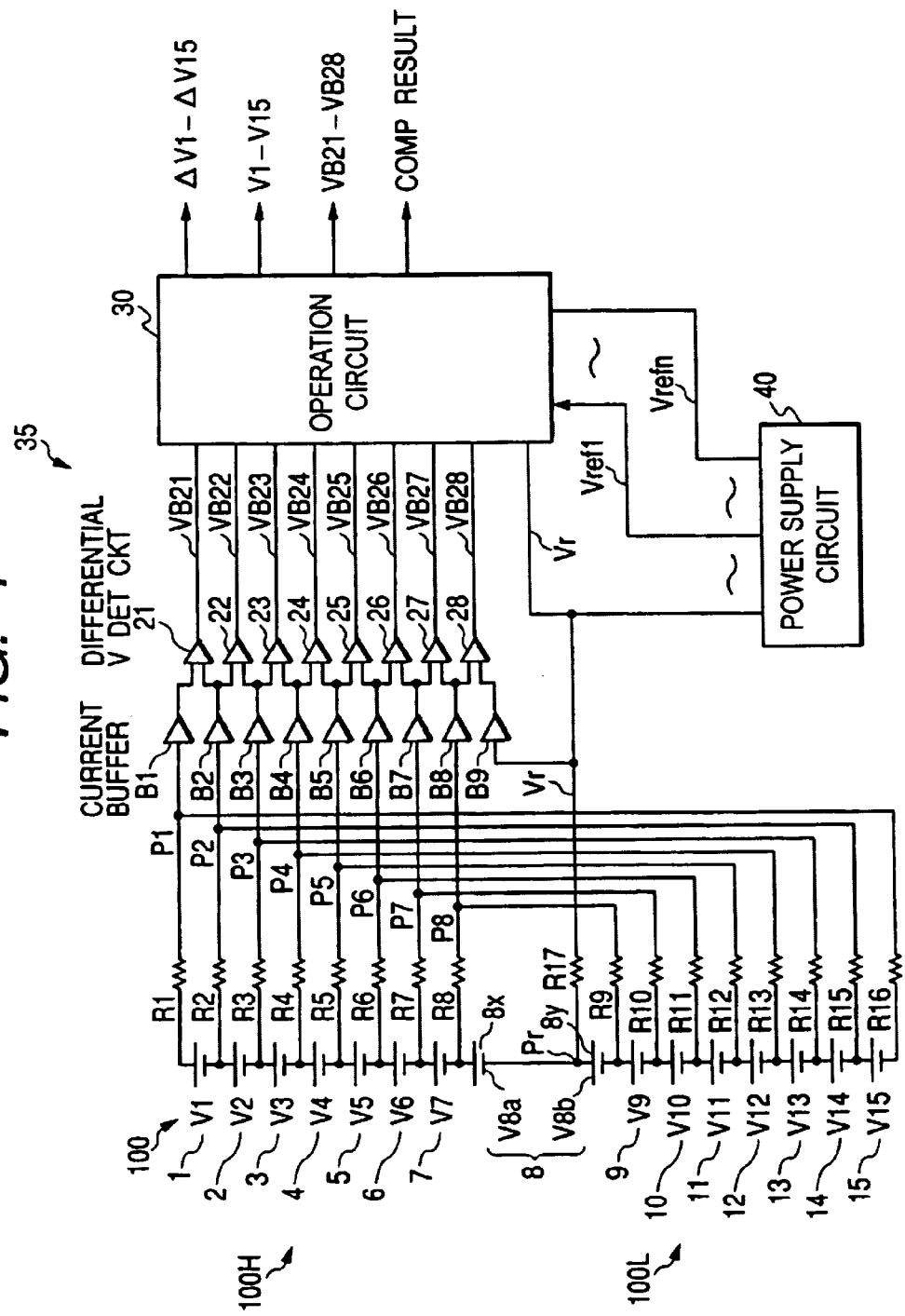
FIG. 1 is a block diagram of a voltage detection device for detecting terminal voltages in a battery package according to the first and second embodiments of the present invention.

FIG. 1 is a block diagram of a voltage detection device for detecting terminal voltages in a battery package according to the first embodiment of the present invention.

The battery package 100 includes fifteen battery modules 1 to 15 connected in series. The battery module 8 is divided into half modules 8x and 8y.

If the number of battery modules in the battery package 100 is even, the battery modules 1 to 7 and 9 to 15 have m single cells connected in series, respectively (m is an even or odd number), and the number of battery modules 8 includes no single cells. That is, battery modules in the battery package 100 is simply divided into two, i.e., high and low voltage groups 100H and 100L.

If the number of battery modules in the battery package 100 is odd, the battery modules 1–15 have m single cells connected in series, respectively (m is an even number), and the battery module 8 includes half modules 8x and 8y including m/2 single cells connected in series, respectively. However, it is also possible that the battery modules 1 to 7 and 9 to 15 have m single cells connected in series, respectively, and the number of battery modules 8 includes half modules 8x and 8y including m single cells, respectively. That is, the battery module 8 includes 2 m single cells (this case is equivalent to the above-mentioned case that the number of battery modules is even). In this case, m may be an odd number. In other words, the battery modules should be divided into the high and low voltage groups 100H and 100L with a symmetrical structure to output the middle potential (reference voltage potential) Vr of the battery package 100.

The half modules 8x and 8y connected in series through a connection point Pr. Here, if m is one, each of the battery modules comprises a single cell.

Positive terminals of battery packages 1 to 8 are connected to first ends of current limiting resistive elements R1 to R8, respectively. Negative terminals of battery packages 9 to 15 are connected to first ends of current limiting resistive elements R9 to R16, respectively. A positive terminal of battery package 8y is connected to a first end of current limiting resistive element R17. The opposite second ends of the current limiting resistive elements R1 to R8 are connected to inputs of buffers B1 to B8 through junction points P1 to P8, respectively. The opposite second ends of the current limiting resistive elements R9 to R16 are also connected to inputs of buffers B1 to B8 through junction points P1 to P8, respectively.

In other words, the battery package 100 includes high and low voltage groups 100H and 100L of battery modules 1–15 connected in series with the connection point Pr therebetween. The high and low voltage groups 100H and 100L include N (8) of the battery modules 1–8x and 8y–15, respectively. The positive terminal of the $L^{th}$ battery module in the high voltage group 100H outputting the highest voltage potential in the battery package 100 when L=1. The negative terminal of the $L^{th}$ battery module in the low voltage group 100L outputting the lowest voltage potential in the battery package 100 when L=1, wherein $1 \leq L \leq N$. The voltage detection device comprises the N junction points P1 to P8, and 2N current limiting resistive elements R1–R8 and R9–R16. The positive terminal of the $L^{th}$ battery module 1–8x in the high voltage group 100H is connected to the $L^{th}$ junction point (P1–P8) through one of the current limiting resistive elements R1–R8. The negative terminal of the same $L^{th}$ battery module 8y–15 in the low voltage group 100L is connected to the $L^{th}$ junction point (P1–P8) through another one of the current limiting resistive elements R9–R16. The voltage detection device further comprises a voltage detection circuit 35 for detecting voltage potentials at the N junction points P1 to P8 and the connection point Pr between the high and low groups 100H and 100L as the data of terminal voltages in the battery package 100.

The voltage detection circuit 35 comprises N voltage difference detection circuits 21 to 28 for detecting voltage differences between the $L^{th}$ and $(L-1)^{th}$ junction points, respectively, wherein $N^{th}$ voltage difference detection circuit 28 detects a voltage difference between the $N^{th}$ junction point and the connection point Pr between the high and low voltage groups 100H and 100L of battery modules.

Moreover, the voltage detection device further comprises a a operation circuit 30 for processing the data to calculate output voltage of the $L^{th}$ battery modules of the high and low voltage groups from the detected voltage potentials, respectively.

The connection point Pr between the half modules 8x and 8y, that is, a negative terminal of the half module 8x is connected to an input of a current buffer B9 through a current limiting resistive element R17. Here, the number of single cells in each half modules 8x and 8y may be the same as that of the other battery modules. Moreover the current buffers B1 to B9 may be omitted.

Outputs of the current buffers B1 to B9 are supplied to differential voltage detection circuits 21 to 28, respectively. Each of the differential voltage detection circuits 21 to 28 detects a voltage potential difference between two junction points (P1–P8) neighboring to each other.

Here, ratios in resistance between the current limiting resistive elements R1 and R16, between the current limiting resistive elements R2 and R15, between the current limiting resistive elements R3 and R14, between the current limiting resistive elements R4 and R13, between the current limiting resistive elements R5 and R12, between the current limiting resistive elements R6 and R11, between the current limiting resistive elements R7 and R10, and between the current limiting resistive elements R8 and R9 are the same. More specifically, the ratio is one in this embodiment. Here, though there is dispersion in resistance between the current limiting resistive elements R1–R16, it is assumed that the dispersion is negligible or fine trimmed.

Here, it is assumed that the module voltage of the battery module 1 is V1; that of the battery module 2, V2; that of the battery module 3, V3; that of the battery module 4, V4; that of the battery module 5, V5; that of the battery module 6, V6; that of the battery module 7, V7; that of the battery module 8, V8 (=V8a+V8b); that of the battery module 9, V9; that of the battery module 10, V10; that of the battery module 11, V11; that of the battery module 12, V12; that of the battery module 13, V13; that of the battery module 14, V14; and that of the battery module 15, V15.

Then, the output voltage VB28 of the differential voltage detection circuit 28 is represented by (V8/2)−Vr. Vr represents a reference voltage potential at the connection point Pr between the half models 8x and 8y. The output voltage VB27 of the differential voltage detection circuit 27 is represented by (V7+V8+V9)/2−(V8)/2=(V7+V9)/2. The output voltage VB26 of the differential voltage detection circuit 26 is represented by (V6+V7+V8+V9+V10)/2−(V7+V8+V9)/2=(V6+V10)/2.

Similarly, the output voltage VB25 of the differential voltage detection circuit 25 is represented by (V5+V11). The output voltage VB24 of the differential voltage detection circuit 24 is represented by (V4+V12). The output voltage VB23 of the differential voltage detection circuit 23 is represented by (V3+V13). The output voltage VB22 of the differential voltage detection circuit 22 is represented by (V2+V14). The output voltage VB21 of the differential voltage detection circuit 21 is represented by (V1+V15).

That is, if the reference voltage potential Vr is known, V8=V8a+V8b can be calculated from the output voltage VB28. Then, if the module voltage V8 is known, (V7+V9) can be calculated from the output voltage VB27. Then, if V8 and (V7+V9) are known, (V6+V10) can be calculated from the output voltage VB26. Then, if V8, (V7+V9), and (V6+V10) are known, (V5+V11) can be calculated from the output voltage VB25. Then, if V8, (V7+V9), (V6+V10), (V5+V11) are known, (V4+V12) can be calculated from the output voltage VB24.

Then, if V8, (V7+V9), (V6+V10), (V5+V11), and (V4+V12) are known, (V3+V13) can be calculated from the output voltage VB23. Then, if V8, (V7+V9), (V6+V10), (V5+V11), (V4+V12), and (V3+V13) are known, (V2+V14) can be calculated from the output voltage VB22. Then, if V8, (V7+V9), (V6+V10), (V5+V11), (V4+V12), and (V3+V13), (V2+V14) are known, (V1+V15) can be calculated from the output voltage VB21.

The reference voltage potential Vr can be detected through the current limiting resistive element R17. Thus, this method provides voltage sums of pairs of different battery modules out of the battery modules 1 to 7, 9 to 15, and the half modules 8x and 8y. Accordingly, if it is assumed that the battery modules 1 to 7 and 9 to 15, and the half modules 8x and 8y are used in this circuit, these battery modules 1 to 7, 9 to 15, 8x, and 8y connected in series are grouped into the high and low groups 100H and 100L symmetrically with respect to the connection point Pr, voltage sums of N pairs of battery modules can be calculated (N=8 in this embodiment and the number of battery modules 1 to 7 and 9 to 15, and half modules 8x and 8y is 2N).

The output voltages VB21 to VB28 of the differential voltage detection circuits 21 to 28 are supplied to an operation circuit 30 which makes the above-mentioned calculation. The operation circuit 30 may comprise an analog operation circuit or A/D converters for converting the output voltages VB21 to VB28 and the reference voltage potential Vr and a microprocessor for making the above-mentioned calculations with a program.

More specifically, the operation circuit 30 operates and outputs variations in the output voltages of the 2N battery modules, respectively from voltage differences between the successive pair of junction points P1 to P8. That is, the operation circuit 30 operates $\Delta$ V1=2(VB21), $\Delta$ V2=2(VB22), $\Delta$ V3=2(VB23), $\Delta$ V4=2(VB24), $\Delta$ V5=2(VB25), $\Delta$ V6=2(VB26), $\Delta$ V7=2(VB27), and $\Delta$ V8=2(VB28) when VB(2j)−VB(2k)>0, k=j−1.

When VB(2j)−VB(2k)<0, k=j−1, the operation circuit 30 outputs $\Delta$ V15=2(VB21), $\Delta$ V14=2(VB22), $\Delta$ V13=2(VB23), $\Delta$ V12=2(VB24), $\Delta$ V11=2(VB25), $\Delta$ V10=2(VB26), $\Delta$ V9=2(VB27), and $\Delta$ V8=2(VB28). Because each battery module 1–15 includes the same type of and same capacity of cells in the initial condition, the operation circuit 30 further calculates (estimates) and outputs the output voltages V1–V15 of the battery modules 1–15 from the standard output voltage of a battery module (or cell) and the variations $\Delta$ V1–$\Delta$ V15 in the output voltage of the battery modules 1–15. Moreover, the full charged voltage tends only to decrease with passage of time, so that the polarity of the differences between the successive junction points P1 to P8 provides information indicating which of battery modules in each pair (1 or 15, for example) varies in the output voltage.

Moreover, the operation circuit 30 may output the output voltages VB21 to VB28 as detection voltage.

The voltage detection device further comprises a power supply circuit 40 for supplying supply powers to the current buffer circuits B1 to B9, the differential voltage detection circuits 21 to 28, and the operation circuit 30 and supplies reference voltage potential Vr, Vref1 to Vrefn. The power for the power supply circuit 40 can be supplied with power from the battery package 100 and can be supplied from an external power source. In this case, the outputs of the power supply circuit 40 are electrically insulated from the inputs thereof with a DC-DC converter having an isolation transformer.

The reference voltages Vref1 to Vrefn have different threshold levels to judge the condition of each output voltage with n steps. The operation circuit 30 outputs the comparing result of output voltages of battery modules 1 to 15 with n threshold levels.

The input dynamic range of the differential voltage detection circuits 21 to 28 is set to have positive and negative predetermined ranges around the reference voltage potential Vr. The differential voltage detection circuits 21 to 28 output the reference voltage potential Vr when the input voltage differences is 0 V, respectively. Thus, the low withstand voltage can be provided.

According to this embodiment, the input voltages at the current buffers B1 to B9 or the differential voltage detection circuits 21 to 28 exist near the reference voltage potential Vr and vary around the reference voltage potential Vr in accordance with the module voltages of the battery modules 1 to 15. Thus, inputs of the current buffers B1 to B9, the differential voltage detection circuits 21 to 28, and the circuit for processing the output voltage of the differential voltage detection circuit 21 to 28 are substantially at the same voltage potential, and thus, this allows making the input dynamic range small. This fact makes designing the voltage detection device easy.

In the first embodiment, the current limiting resistive element R17 can be omitted.

[Second Embodiment]

In the first embodiment, it is assumed that the ratios in resistance between pairs of current limiting resistive elements R1 to R16 connected in series are one. However, in the second embodiment, in consideration of dispersion in resistances in the current limiting resistive elements R1 to R16, resistances of the current limiting resistive elements R1 to R16 are previously measured and stored in the operation circuit 30 which operates the pairs of module voltages can be calculated with dispersion in resistance being compensated.

[Third Embodiment]

Figure 2:
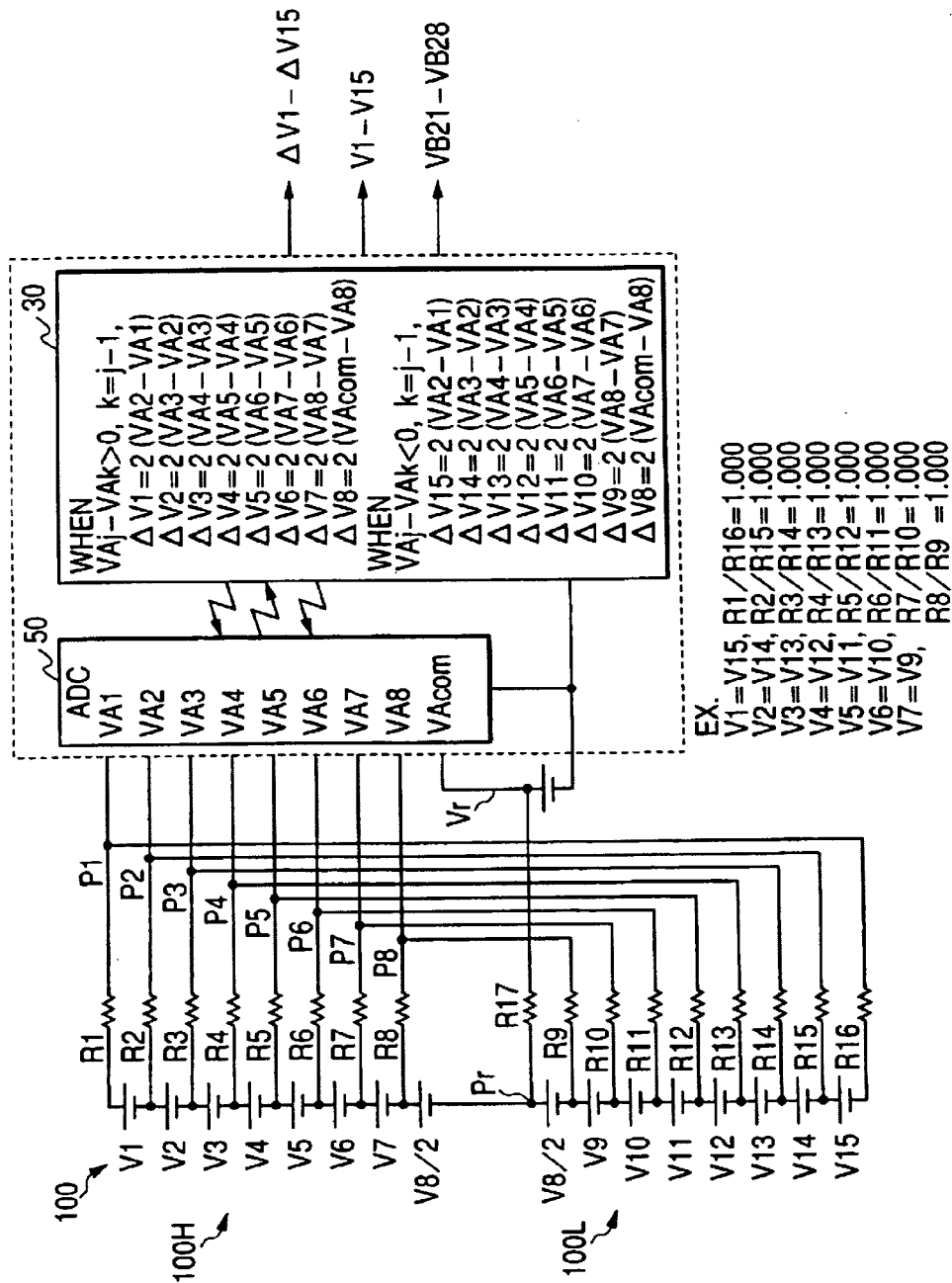
FIG. 2 shows a voltage detection device according to a third embodiment.

FIG. 2 shows a voltage detection device according to a third embodiment. The voltage detection device according to the third embodiment has substantially the same structure as that of the first embodiment. The difference is in that the current buffers B1 to B8 and the differential voltage detection circuits 21 to 28 in the first embodiment are replaced with an A/D converting circuit 50 including eight A/D converters VA1 to VA8 and a microprocessor 30. The A/D converters VA1 to VA8 A/D-convert the voltage difference between the junction points P1 to P8 and a reference potential Vr=VAcom, respectively.

Moreover, the operation circuit 30 operates variation in output voltages of battery modules 1 to 15 from voltage differences between the successive pair of junction points P1 to P8. That is, the operation circuit 30 operates Δ V1=2 (VA2−VA1), Δ V2=2(VA3−VA2), Δ V3=2(VA4−VA3), Δ V4=2(VA5−VA4), Δ V5=2(VA6−VA5), Δ V6=2(VA7−VA6), Δ V7=2(VA8−VA7), and Δ V8=2(VAcom−VA8) when VAj−VAk>0, k=j−1.

That is, the operation circuit 30 operates Δ V15=2(VA2−VA1), Δ V14=2(VA3−VA2), Δ V13=2(VA4−VA3), Δ V12=2(VA5−VA4), Δ V11=2(VA6−VA5), Δ V10=2(VA7−VA6), Δ V9=2(VA8−VA7), and Δ V8=2(VAcom−VA8) when Aj−VAk<0, k=j−1, (j=L).

Because each of battery modules 1–15 includes the same type of and same capacity of cells in the initial condition, the output voltage of each battery modules 1–15 are further calculated with the standard output voltage and the variations in the output voltage of the battery modules 1–15. Moreover, the fully-charged voltage tends only to decrease with passage of time, so that the polarity of the differences between the successive junction points P1 to P8 indicates which of battery modules in each pair (V1 or V15, for example) varies in the output voltage.

In fact, each of the A/D converters VA1 to VA8 includes a differential detection circuit for detecting the voltage difference between each of the junction points P1 to P8 and the reference voltage potential Vr=VAcom, and an A/D converter for A/D converting the output of the differential detection circuit.

According to this embodiment, the potentials at junction points P1 to P8 vary within a small range around the reference voltage potential Vr=VAcom. This fact allows the A/D converters VA1 to VA8 to have low withstand voltage requirements and to have a simple structure.

As mentioned above, the voltage detection device according to the third embodiment further comprises the operation circuit 30 (data processing circuit) for processing the data of terminal voltages in the battery package 100 to calculate sum voltages of each battery module of the high and low voltage groups 100H and 100L from the data.

The operation circuit 30 shown in FIG. 2 further operates and outputs the voltage differences between said $L^{th}$ and $(L+1)^{th}$ junction points P1 to P8, respectively, and a voltage difference between $N^{th}$ junction point P8 and a connection point Pr between said high and low voltage groups 100H and 100L of battery modules from the outputs of the A/D converters VA1 to VA8 and VAcom.

[Fourth Embodiment]

Figure 3:
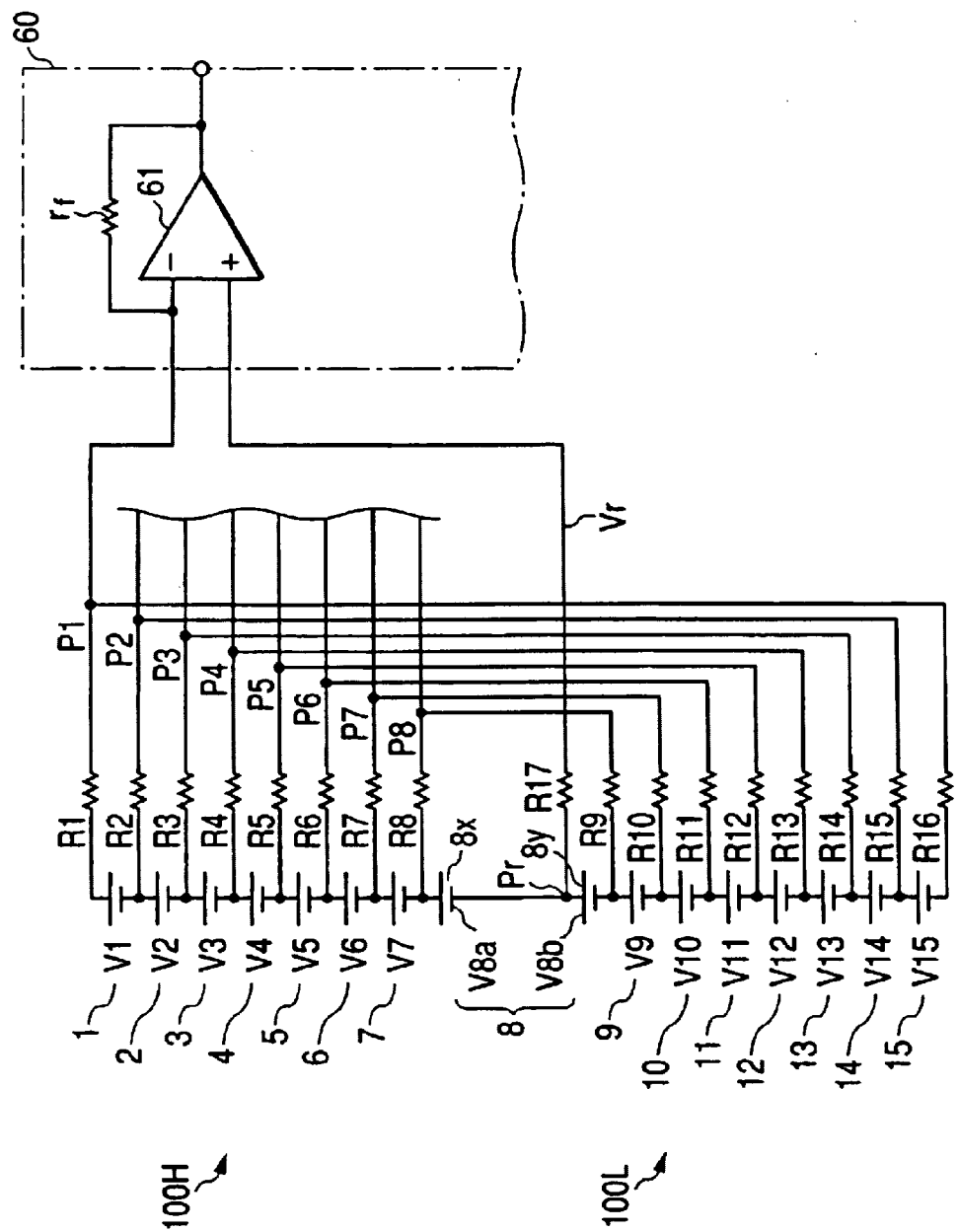
FIG. 3 shows a voltage detection device according to a fourth embodiment.

FIG. 3 shows a voltage detection device according to a fourth embodiment. The voltage detection device according to the fourth embodiment has substantially the same structure as that of the third embodiment. The difference is in that an amplifier circuit 60 replaces the A/D converting circuit 50. That is, operational amplifiers 61 replace the A/D converters VA1 to VA8 in the third embodiment, respectively. Here, in the drawing in FIG. 3, only one amplifier 61 is representatively shown. More specifically, the junction points P1 to P8 are connected to inverting inputs of the operational amplifiers 61 and the reference voltage potential Vr is supplied to non-inverting inputs of the operational amplifiers 61 to obtain the differences between the potentials P1 to P8 and the reference voltage potential Vr, respectively. The inverting inputs of the operational amplifiers 61 are connected to their outputs through feedback resistors rf, respectively. This structure also provides the low withstand voltage in the circuit. The voltage detection device according to the fourth embodiment further comprises the amplifier circuit 60 (potential difference detection circuit) for detecting potential difference between voltage potentials at N junction points (P1 to P8) and the reference voltage at the connection point Pr between the high and low voltage groups 100H and 100L of battery modules V1 to V15.

[Fifth Embodiment]

Figure 4:
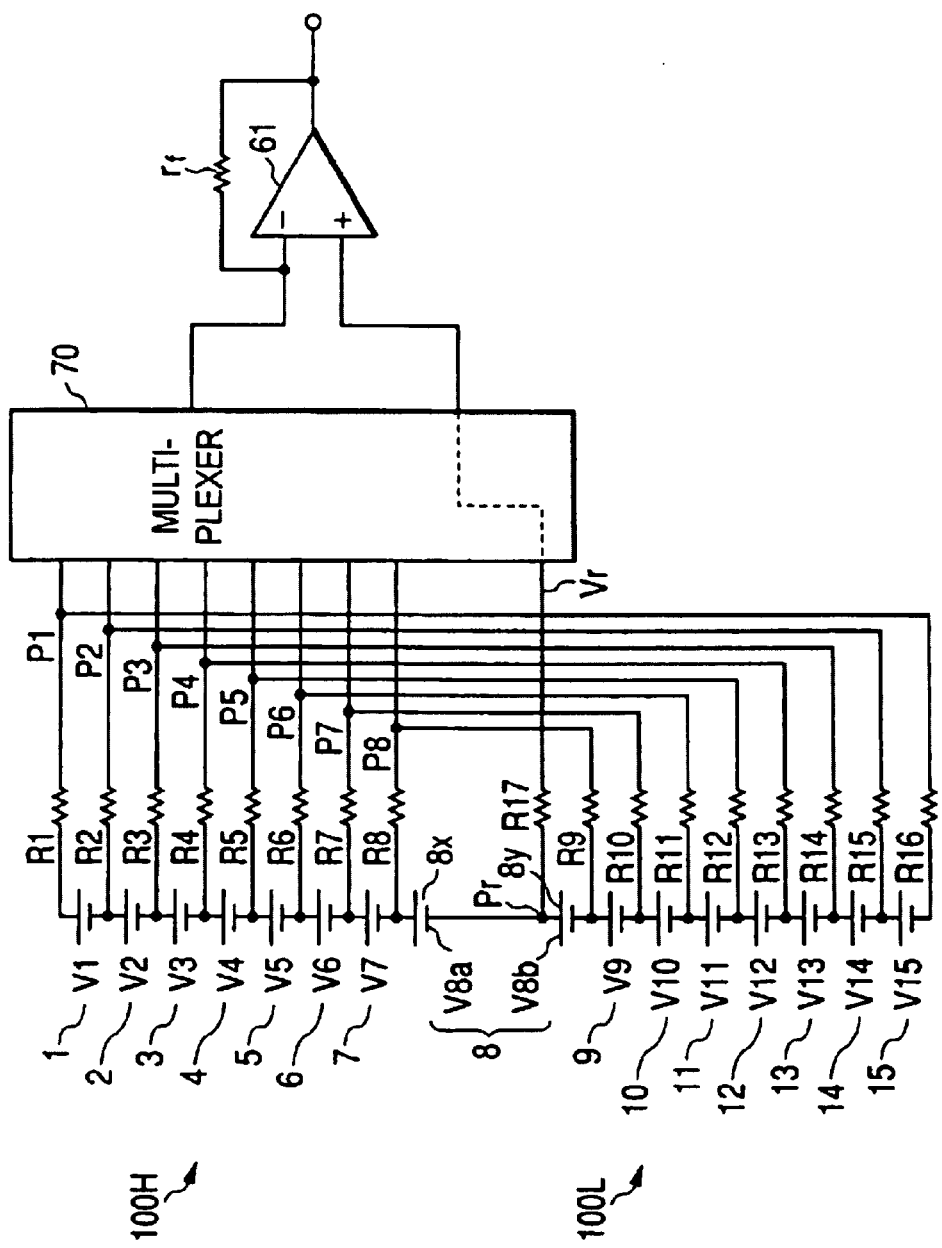
FIG. 4 shows a voltage detection device according to a fifth embodiment.

FIG. 4 shows a voltage detection device according to a fifth embodiment. The voltage detection device according to the fifth embodiment has substantially the same structure as that of the fourth embodiment. The difference is in that the amplifier circuit 60 is replaced with a multiplexer 70 and one operational amplifier 61. The multiplexer 70 successively supplies the voltage potentials P1 to P8 to the operational amplifier 61 to successively obtain the voltage differences between the voltage potentials P1 to P8 and the reference voltage potential Vr.

Moreover, in FIG. 2, the multiplexer 70 and one A/D converter can replace the A/D converters VA1 to VA8. In these cases (FIGS. 2 and 4), the differences in the input voltage potentials at respective sampling switches in the multiplexer 70 are small, and the voltage variation ranges are also small, so that the structure of the sampling switches in the multiplexer 70 can be simplified.

[Sixth Embodiment]

Figure 5:
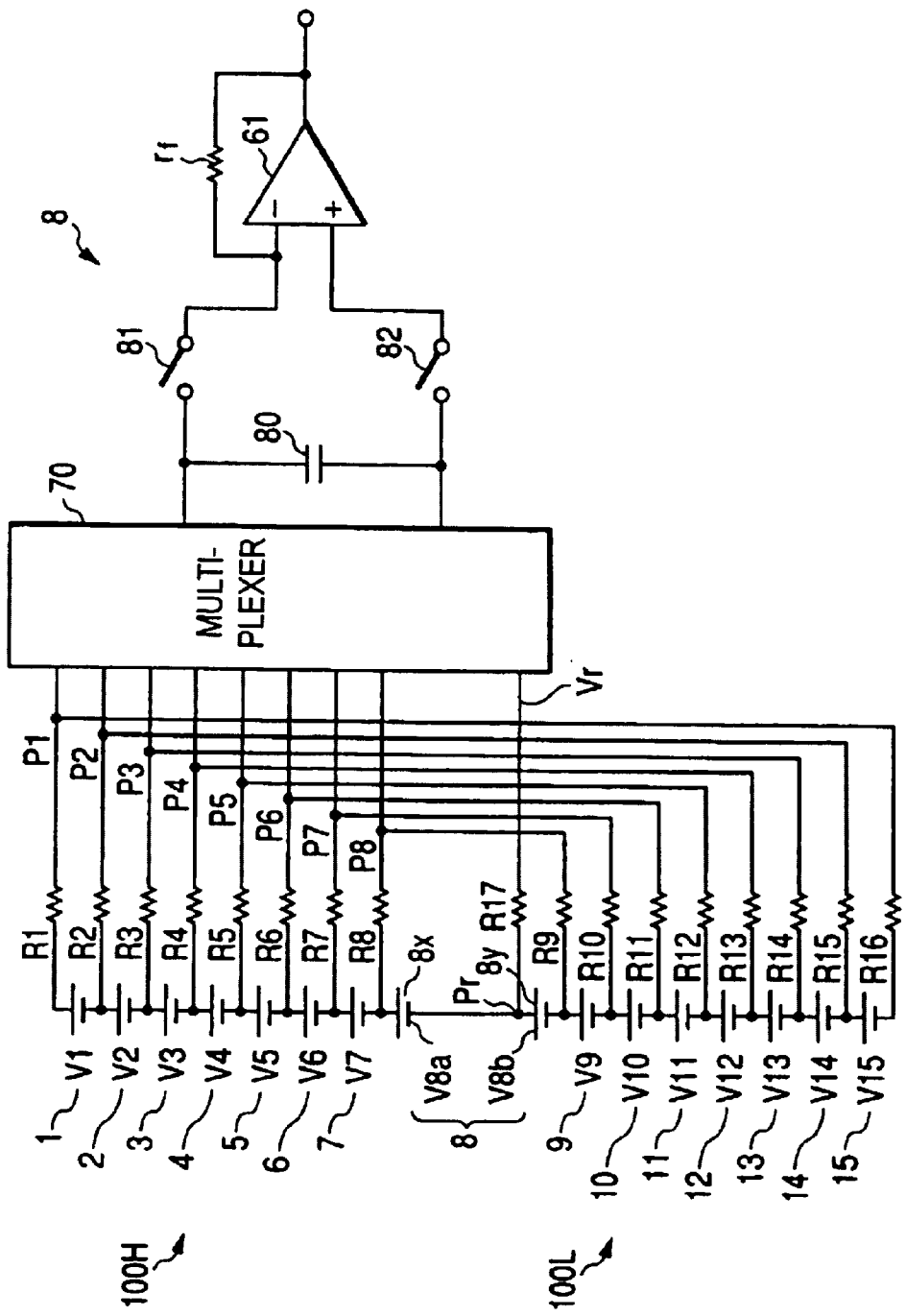
FIG. 5 shows a voltage detection device according to a sixth embodiment.

FIG. 5 shows a voltage detection device according to a sixth embodiment. The voltage detection device according to the sixth embodiment has substantially the same structure as that of the fifth embodiment. The difference is in that a flying capacitor circuit 8 is further provided. That is, a flying capacitor 80 and output sampling switches 81 and 82 are further provided. An output of the multiplexer 70 is connected to a first end of the flying capacitor 80 and to a first end of the switch 81. The reference voltage potential Vr at the connection point Pr between the half modules 8x and 8y is connected to the opposite second end of the flying capacitor 80 through the multiplexer 70 and to a first end of the switch 82. The opposite second end of the switch 81 is connected to the inverting input of the operational amplifer 61. The opposite second end of the switch 82 is connected to the non-inverting input of the operational amplifier 61. The multiplexer 70 connects one of voltage potentials P1 to P8 to the first end of the flying capacitor 80 to charge the flying capacitor. Next, the multiplexer 70 opens the sampling switch, and then, the switches 81 and 82 are closed to supply the charged voltage difference to the operational amplifer 61. This structure also allows the voltage detection device to have a relatively low withstand voltage.

[Seventh Embodiment]

Figure 6:
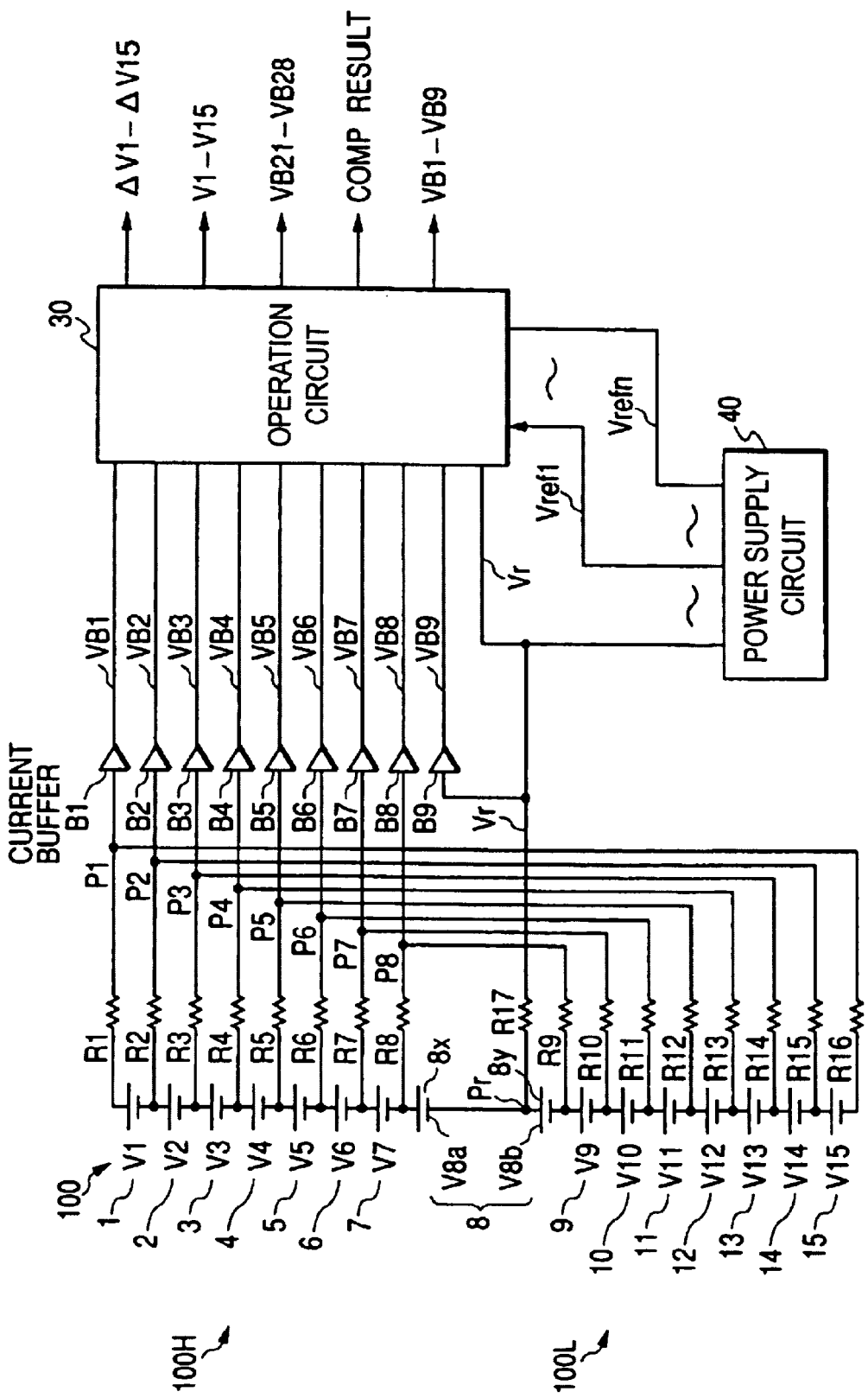
FIG. 6 is a block diagram of a voltage detection device for detecting terminal voltages in a battery package according to a seventh embodiment of the present invention.

In the first embodiment, the differential voltage detection circuits 21 to 28 are provided. However, the outputs VB1 to VB9 of the current buffers B1 to B9 may be directly sent to the operation circuit 30 to detect the voltage potentials at the junction points P1 to P8 to output the detected voltage potentials at the junction points P1 to P8 and the reference voltage potential Vr as conditional data of the battery modules 1–15. FIG. 6 shows this structure.

The operation circuit 30 shown in FIG. 6 operates the voltage differences between said $L^{th}$ and $(L+1)^{th}$ junction points P1 to P8, respectively, and a voltage difference between $N^{th}$ junction point P8 and a connection point Pr between said high and low voltage groups 100H and 100L of battery modules 1–15 from the outputs of the current buffers B1 to B9 and outputs the voltage differences as the conditional data of the battery modules 1–15. Moreover, the operation circuit 30 outputs the module voltages V1 to V15, the variations in module voltages Δ V1 to Δ V15 from the operated voltage differences as conditional data of the battery modules 1–15 in the same way as the first embodiment.

What is claimed is:

1. A voltage detection device for a battery package including high and low voltage groups of battery modules connected in series, said high and low voltage groups including N of said battery modules connected in series, respectively, a positive terminal of the $L^{th}$ battery module in said high voltage group outputting the highest voltage potential in said battery package when L=1, a negative terminal of the $L^{th}$ battery module in said low voltage group outputting the lowest voltage potential in said battery package when wherein L=1, $1 \leq L \leq N$;

N junction points;

2N current limiting resistive elements, a positive terminal of said $L^{th}$ battery module in said high voltage group being connected to the $L^{th}$ junction point through one of said current limiting resistive elements, a negative terminal of said $L^{th}$ battery module in said low voltage group being connected to said $L^{th}$ junction point through another one of said current limiting resistive elements; and voltage detection means for detecting and outputting voltage potentials at said N junction points.

2. The voltage detection device as claimed in claim 1, further comprising N voltage difference detection circuits for detecting and outputting voltage differences between said $L^{th}$ and $(L+1)^{th}$ junction points, respectively, wherein said $N^{th}$ voltage difference detection circuit detects a voltage difference between said $N^{th}$ junction point and a connection point between said high and low voltage groups of battery modules.

3. The voltage detection device as claimed in claim 1, further comprising potential difference detection means for detecting and outputting potential differences between voltage potentials at said N junction points and a reference voltage at a connection point between said high and low voltage groups of battery modules.

4. The voltage detection device as claimed in claim 1, further comprising data processing means for calculating output voltages of said 2N battery modules from said detected voltage potentials, respectively.

5. The voltage detection device as claimed in claim 2, further comprising data processing means for calculating output voltages of said 2N battery modules from outputs of said N voltage difference detection circuits, respectively.

6. The voltage detection device as claimed in claim 3, further comprising data processing means for calculating output voltages of said 2N battery modules from said detected potential differences, respectively.

7. The voltage detection device as claimed in claim 5, wherein said data processing means calculates variations in said output voltages of said 2N battery modules, respectively.

8. The voltage detection device as claimed in claim 6, wherein said data processing means calculates variations in said output voltages of said 2N battery modules, respectively.

9. A voltage detection device for a battery package including high and low voltage groups of battery modules connected in series, said high and low voltage groups including N of said battery modules connected in series, respectively, a positive terminal of the $L^{th}$ battery module in said high voltage group outputting the highest voltage potential in said battery package when L=1, a negative terminal of the $L^{th}$ battery module in said low voltage group outputting the lowest voltage potential in said battery package when wherein L=1, $1 \leq L \leq N$;

N junction points;

2N current limiting resistive elements, a positive terminal of said $L^{th}$ battery module in said high voltage group being connected to the $L^{th}$ junction point through one of said current limiting resistive elements, a negative terminal of said $L^{th}$ battery module in said low voltage group being connected to said $L^{th}$ junction point through another one of said current limiting resistive elements; and voltage detection and operation means for detecting voltage potentials at said N junction points and for obtaining and outputting conditional data of said battery modules from said detected voltage potentials.

10. The voltage detection device as claimed in claim 9, wherein said voltage detection and operation means comprises N voltage difference detection circuits for detecting voltage differences between said $L^{th}$ and $(L+1)^{th}$ junction points, respectively, wherein said $N^{th}$ voltage difference detection circuit detects a voltage difference between said $N^{th}$ junction point and a connection point between said high and low voltage groups of battery modules to obtain said conditional data from said voltage differences.

11. The voltage detection device as claimed in claim 9, wherein said voltage detection and operation means comprises potential difference detection means for detecting potential differences between voltage potentials at said N junction points and a reference voltage at a connection point between said high and low voltage groups of battery modules to obtain said conditional data from said potential differences.

12. The voltage detection device as claimed in claim 9, wherein said voltage detection and operation means comprises calculating means for calculating output voltages of said 2N battery modules from said detected voltage potentials, respectively.

* * * * *